(12) United States Patent
Okumura et al.

(10) Patent No.: US 8,257,501 B2
(45) Date of Patent: Sep. 4, 2012

(54) PLASMA DOPING DEVICE WITH GATE SHUTTER

(75) Inventors: Tomohiro Okumura, Osaka (JP); Yuichiro Sasaki, Toyko (JP); Katsumi Okashita, Osaka (JP); Bunji Mizuno, Nara (JP); Hiroyuki Ito, Chiba (JP); Ichiro Nakayama, Osaka (JP); Cheng-Guo Jin, Osaka (JP)

(73) Assignee: Panasonic Corporation, Osaka (JP)

( * ) Notice: Subject to any disclaimer, the term of this patent is extended or adjusted under 35 U.S.C. 154(b) by 598 days.

(21) Appl. No.: 11/887,323

(22) PCT Filed: Mar. 29, 2006

(86) PCT No.: PCT/JP2006/306561
§ 371 (c)(1),
(2), (4) Date: Feb. 13, 2009

(87) PCT Pub. No.: WO2006/114976
PCT Pub. Date: Nov. 2, 2006

(65) Prior Publication Data
US 2009/0176355 A1 Jul. 9, 2009

(30) Foreign Application Priority Data
Mar. 30, 2005 (JP) .................... 2005-099149

(51) Int. Cl.
*C23C 16/00* (2006.01)
(52) U.S. Cl. ....................... 118/733; 118/719
(58) Field of Classification Search .................. 118/715, 118/719, 722, 723 R, 723 E; 156/345.31, 156/345.32, 345.43, 345.44, 345.45, 345.46, 156/345.47
See application file for complete search history.

(56) References Cited

U.S. PATENT DOCUMENTS

| | | | |
|---|---|---|---|
| 4,912,065 A | 3/1990 | Mizuno et al. | |
| 5,592,581 A * | 1/1997 | Okase | 392/418 |
| 6,050,216 A * | 4/2000 | Szapucki et al. | 118/723 E |
| 6,090,304 A * | 7/2000 | Zhu et al. | 216/79 |
| 6,111,225 A * | 8/2000 | Ohkase et al. | 219/390 |
| 6,197,121 B1 * | 3/2001 | Gurary et al. | 118/725 |
| 6,221,782 B1 * | 4/2001 | Shan et al. | 438/710 |
| 6,403,410 B1 * | 6/2002 | Ohira et al. | 438/181 |
| 6,889,627 B1 * | 5/2005 | Hao | 118/723 R |
| 2004/0149214 A1 | 8/2004 | Hirose et al. | |
| 2007/0051471 A1 * | 3/2007 | Kawaguchi et al. | 156/345.36 |

FOREIGN PATENT DOCUMENTS

| | | |
|---|---|---|
| JP | 10-199957 | 7/1998 |
| JP | 2000-323422 | 11/2000 |

(Continued)

*Primary Examiner* — Maureen Gramaglia
(74) *Attorney, Agent, or Firm* — McDermott Will & Emery LLP

(57) ABSTRACT

In a plasma doping device according to the invention, a vacuum chamber (1) is evacuated with a turbo-molecular pump (3) as an exhaust device via a exhaust port 11 while a predetermined gas is being introduced from a gas supply device (2) in order to maintain the inside of the vacuum chamber (1) to a predetermined pressure with a pressure regulating valve (4). A high-frequency power of 13.56 MHz is supplied by a high-frequency power source (5) to a coil (8) provided in the vicinity of a dielectric window (7) opposed to a sample electrode (6) to generate inductive-coupling plasma in the vacuum chamber (1). A high-frequency power source (10) for supplying a high-frequency power to the sample electrode (6) is provided. Uniformity of processing is enhanced by driving a gate shutter (18) and covering a through gate (16).

4 Claims, 10 Drawing Sheets

FOREIGN PATENT DOCUMENTS

| | | |
|---|---|---|
| JP | 2003-303812 | 10/2003 |
| WO | WO 00/75972 A1 | 12/2000 |
| WO | WO 2004/109785 A1 | 12/2004 |
| WO | WO 2004109785 A1 * | 12/2004 |

* cited by examiner

PLASMA DOPING DEVICE WITH GATE SHUTTER

RELATED APPLICATIONS

This application is the U.S. National Phase under 35 U.S.C. §371 of International Application No. PCT/JP2006/306561, filed on Mar. 29, 2006, which in turn claims the benefit of Japanese Application No. 2005-099149, filed on Mar. 30, 2005, the disclosures of which Applications are incorporated by reference herein.

TECHNICAL FIELD

The present invention relates to a plasma doping method for introducing impurities into the surface of a solid sample such as a semiconductor substrate and a plasma-processing device for plasma-processing a sample.

BACKGROUND ART

As a technique to introduce impurities into a solid sample, the plasma doping method is known for ionizing impurities and introducing the ionized impurities into a solid with low energy (for example, refer to Patent Reference 1). FIG. 9 shows a general configuration of a plasma-processing device used for the plasma doping method as a related art impurity introducing method described in the Patent Reference 1. In FIG. 9, a sample electrode 6 for mounting a sample 9 composed of a silicon substrate is provided in a vacuum chamber 1. In the vacuum chamber 1 are provided a gas supply device 2 for supplying a doping rare material gas such as $B_2H_6$ and a pump 3 for depressurizing the inside of the vacuum chamber 1 in order to maintain the inside of the vacuum chamber 1 at a constant pressure. Microwaves are radiated from a microwave waveguide 41 into the vacuum chamber 1 via a quartz plate 42 as a dielectric window. Interaction of the microwaves and the DC magnetic field formed by an electromagnet 43 forms high magnetic field microwave plasma (electron cyclotron resonance plasma) 44 in the vacuum chamber 1. To the sample electrode 6 is connected a high-frequency power source 10 via a capacitor 45 so as to control the potential of the sample electrode 6. Gas supplied from a gas supply device 2 is introduced into the vacuum chamber 1 from gas flow-out holes 46 and is exhausted into a pump 3 from an exhaust port 11.

In a plasma processing device thus configured, a doping raw material gas introduced from the gas inlet 46, for example $B_2H_6$ is turned into plasma by way of plasma generating means including the microwave waveguide 41 and the electromagnet 43 and boron ions in the plasma 44 is introduced into the surface of the sample 9 by way of the high-frequency power source 10.

After a metallic wiring layer is formed on the sample 9 on which impurities have been introduced, a thin oxide film is formed on the metallic wiring layer in a predetermined oxidizing atmosphere and then a date electrode is formed on the sample 9 by using a CVD device or the like to obtain a MOS transistor, for example.

In the field of a general plasma-processing device, a plasma processing device including a gate shutter is known (for example, refer to Patent Reference 2). FIG. 10 shows the general configuration of a related art dry etching device described in Patent Reference 2. In FIG. 10, a sample is transferred into the vacuum chamber 1 via the through gate (gate passage) 51 of the vacuum chamber 1 and then the sample is mounted on the sample electrode 6 in the vacuum chamber 1 and plasma processing is made on the sample in the vacuum chamber 1. A reaction chamber 1 as a vacuum chamber includes a cover 52 for preventing the reactive products from being built up on the gate passage 51 by covering an opening at the reaction chamber as an opening of the gate passage 51 in the reaction chamber when a semiconductor wafer as a sample is processed in the reaction chamber 1 as a vacuum chamber. The cover 52 includes a shielding plate 53 and a base seat 54 on which the shielding plate 53 is mounted. The shielding plate 53 is a belt-like thin plate formed along the inner wall 1b of the reaction chamber 1 and having a width dimension larger than the width dimension of the opening at the reaction chamber so as to cover the entire opening at the reaction chamber. A numeral 55 represents a preliminary chamber, 56 a gate valve, 57 a transfer arm, and 58 a driving device. (Description of a component with an asterisk (*) is omitted.)

Patent Reference 1: U.S. Pat. No. 4,912,065
Patent Reference 2: JP-A-10-199957

DISCLOSURE OF THE INVENTION

Problems that the Invention is to Solve

The related art has a problem of poor uniformity of introduction amount (dose) of impurities into a sample plane. The gas flow-out holes 46 are arranged anisotropically so that the dose is large in a position close to the gas flow-out holes 46 and small in a position distant from the flow-out holes 46. Another problem is variations in the dose caused by the influence of a through gate (not shown).

Thus, an attempt has been made to perform plasma doping by using a plasma processing device described in Patent Reference 2 with the result that particles are generated when a gate shutter is driven.

The invention has been accomplished in view of the above circumstances. An object of the invention is to provide a plasma doping method excellent in the uniformity of concentration of impurities introduced in the surface of a sample and a plasma-processing device capable of uniformly performing plasma processing of a sample.

Means for Solving the Problems

The invention provides a plasma doping method comprising steps of: transferring a sample into a vacuum chamber via the through gate of the vacuum chamber; mounting the sample on a sample electrode in the vacuum chamber; evacuating the inside of the vacuum chamber while flowing a gas toward the sample almost isotropically from a surface opposed to the sample; generating plasma in the vacuum chamber while controlling the inside of the vacuum chamber at a predetermined pressure; and causing impurity ions in the plasma to collide with the surface of the sample to introduce the impurity ions into the surface of the sample; wherein the through gate is covered with a gate shutter when plasma is generated.

With this arrangement, it is possible to provide a plasma doping method excellent in the uniformity of concentration of impurities introduced into the sample surface.

The plasma doping method according to the invention preferably generates plasma in a vacuum chamber by supplying a plasma source with a high-frequency power. With this arrangement, it is possible to perform plasma doping at high speed while maintaining the uniformity of impurities introduced into the surface of the sample.

The plasma doping method according to the invention is an especially useful plasma doping method in case the sample is a semiconductor substrate made of silicon. The plasma doping method is especially useful in case the purities are arsenic, phosphorus, boron, aluminum, or antimony.

With this arrangement, it is possible to manufacture an ultrafine silicon semiconductor device.

The invention provides a plasma processing device comprising: a vacuum chamber; a sample electrode; a gas supply device for supplying gas into the vacuum chamber; gas flow-out holes arranged isotropically while opposed to the sample electrode; an exhaust port for evacuating the inside of the vacuum chamber; a pressure controller for controlling the pressure inside the vacuum chamber; and a sample electrode power source for supplying power to the sample electrode; wherein the vacuum chamber includes a through gate and a gate shutter including a driving device movable between an open position where the through gate is opened and a close position where the through gate is covered.

With this arrangement, it is possible to provide a plasma-processing device capable of uniformly performing plasma processing on a sample. In particular, uniform plasma doping is made possible.

In the plasma-processing device according to the invention, the gate shutter preferably has a cylindrical shape. With this arrangement, it is possible to uniformly process a circular sample.

The vacuum chamber preferably has a cylindrical shape. With this arrangement, it is possible to uniformly process a circular sample.

The plasma-processing device preferably includes a cylindrical inner chamber fixed to the vacuum chamber inside the gate shutter. With this arrangement, it is possible to enhance the wet maintainability of the device.

The lowermost part of the inner chamber is preferably positioned below the lowermost part of the gate shutter. With this arrangement, it is possible to enhance the wet maintainability of the device.

The lowermost part of the inner chamber is preferably positioned below the upper surface of the sample electrode. With this arrangement, it is possible to enhance the wet maintainability of the device.

The driving device preferably includes a motor, a rotary body in intimate contact with the gate shutter, and a transmission part for transmitting the rotary motion of the motor to the rotary body. With this arrangement, it is possible to smoothly drive the gate shutter.

The rotary body is preferably made of an elastic resin. With this arrangement, it is possible to prevent generation of particles caused by rotation of the gate shutter.

The inner chamber is preferably fixed to the vacuum chamber by placing a hood part projecting outside the cylinder on the upper surface of the vacuum chamber. With this arrangement, it is possible to prevent generation of particles caused by rotation of the gate shutter.

The inner chamber and the gate shutter are preferably coupled to each other with a cylindrical bearing unit. With this arrangement, it is possible to smoothly rotate the gate shutter.

The plasma-processing device preferably includes the bearing unit in each of two positions, an upper position and a lower position. With this arrangement, it is possible to prevent generation of particles caused by rotation of the gate shutter.

Preferably, the inner periphery of a convex part projecting inside the cylinder of the gate shutter is fitted to a concave part provided outside the cylinder of the inner chamber, the bearing unit is provided between the convex part and the concave part, and the inner diameter of the convex part is smaller than the external shape of the cylinder of the inner chamber. With this arrangement, it is possible to prevent generation of particles caused by rotation of the gate shutter.

DESCRIPTION OF REFERENCE NUMERALS AND SIGNS

Figure 1:
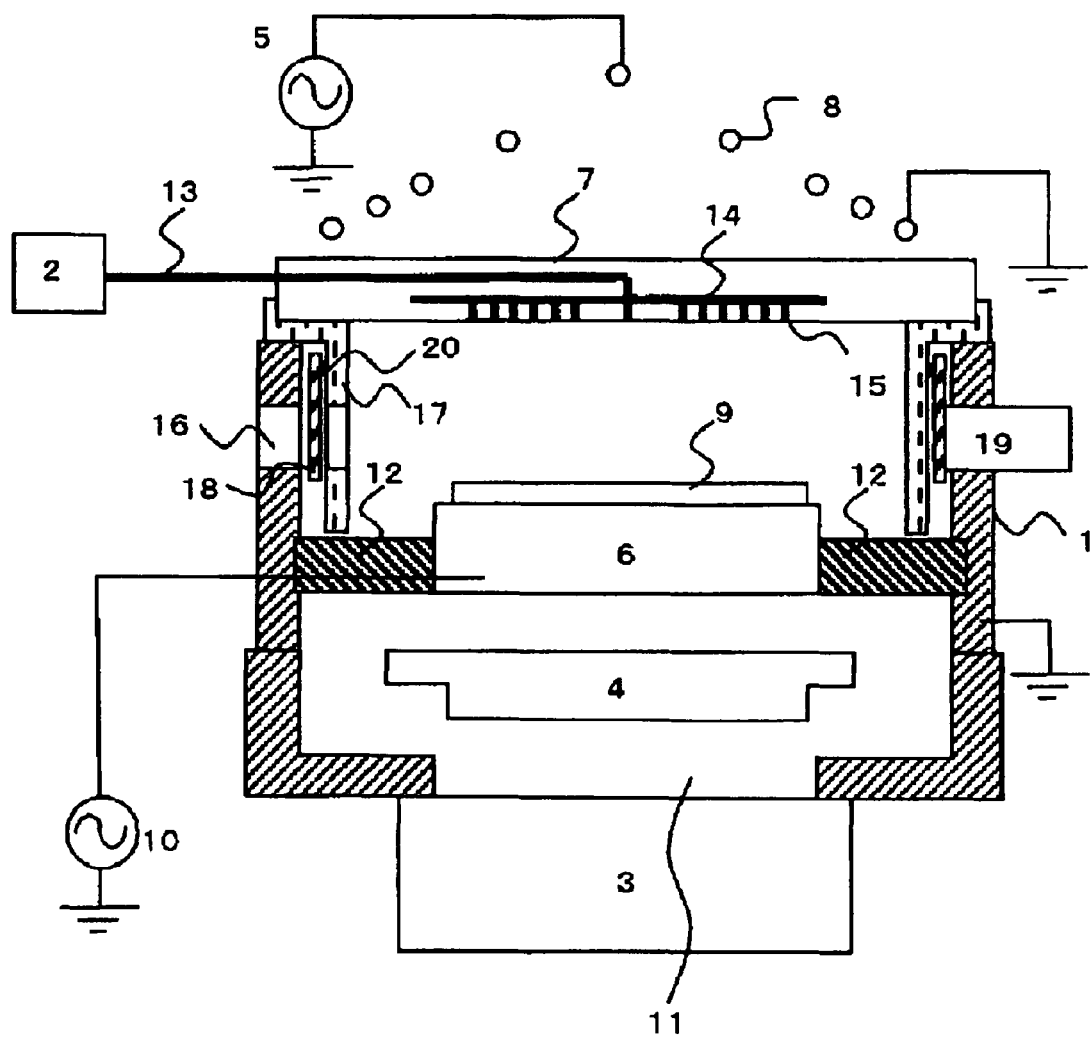
FIG. 1 is a cross-sectional view of a plasma-doping chamber used in the first embodiment of the invention.

1: Vacuum chamber
2: Gas supply device
3: Turbo-molecular pump
4: Pressure regulating valve
5: High-frequency power source for a plasma source
6: Sample electrode
7: Dielectric window
8: Coil
9: Substrate
10: High-frequency power source for a sample electrode
11: Exhaust port
12: Support
13: Gas introduction path
14: Gas main path
15: Gas flow-out hole
16: Through gate
17: Inner chamber
18: Gate shutter
19: Driving device

BEST MODE FOR CARRYING OUT THE INVENTION

Embodiments of the invention will be described referring to drawings.

Embodiment 1

Embodiment 1 of the invention will be will be described referring to FIGS. 1 to 3.

FIG. 1 is a cross-sectional view of a plasma-doping device used in the first embodiment of the invention. In FIG. 1, a vacuum chamber 1 is evacuated with a turbo-molecular pump 3 as an exhaust device while a predetermined gas is being introduced from a gas supply device 2 in order to maintain the inside of the vacuum chamber 1 to a predetermined pressure with a pressure regulating valve 4. A high-frequency power of 13.56 MHz is supplied by a high-frequency power source 5 to a coil 8 (a cross-section thereof is shown in FIG. 1) provided in the vicinity of a dielectric window 7 opposed to a sample electrode 6 to generate inductive-coupling plasma in the vacuum chamber 1. A silicon substrate 9 as a sample is mounted on the sample electrode 6. A high-frequency power source 10 for supplying a high-frequency power to the sample electrode 6 is provided. The high-frequency power source 10 functions as a voltage source for controlling the potential of the sample electrode 6 so that the substrate 9 as a sample will have a negative potential with respect to the plasma. This makes it possible to accelerate ions in the plasma toward the surface of the sample and introduce impurities into the surface of the sample. Gas supplied from the gas supply device 2 is exhausted from the exhaust port 11 to the pump 3. The turbo-molecular pump 3 and the exhaust port 11 are arranged just below the sample electrode 6. The pressure regulating valve 4 is an elevating valve arranged just below the sample electrode 6 and just above the turbo-molecular pump 3. The sample electrode 6 is a base seat of a nearly square shape on which the substrate 9 is mounted and is fixed to the vacuum chamber 1 at each side via total four supports 12.

A flow controller (mass flow controller) provided in the gas supply device 2 controls the flow of gas including an impurity material gas. In general, a gas obtained by diluting an impurity material gas with helium, for example, a gas obtained by diluting diborane ($B_2H_6$) with helium (He) up to 0.5% is used as an impurity material gas, which is subjected to flow control by a first mass flow controller. Flow control of helium is made by a second mass flow controller. Gases flow-controlled by the first and second mass flow controllers are mixed with each other in the gas supply device 2 and the resultant mixture gas is guided into the gas main path 14 via piping (gas introduction path) 13. The mixture gas is guided into the vacuum chamber 1 from gas flow-out holes 15 via a plurality of holes communicated with the gas main path 14. The plurality of gas flow-out holes 15 flow-out gas toward the sample 9 from a surface opposed to the sample 9.

Figure 2:
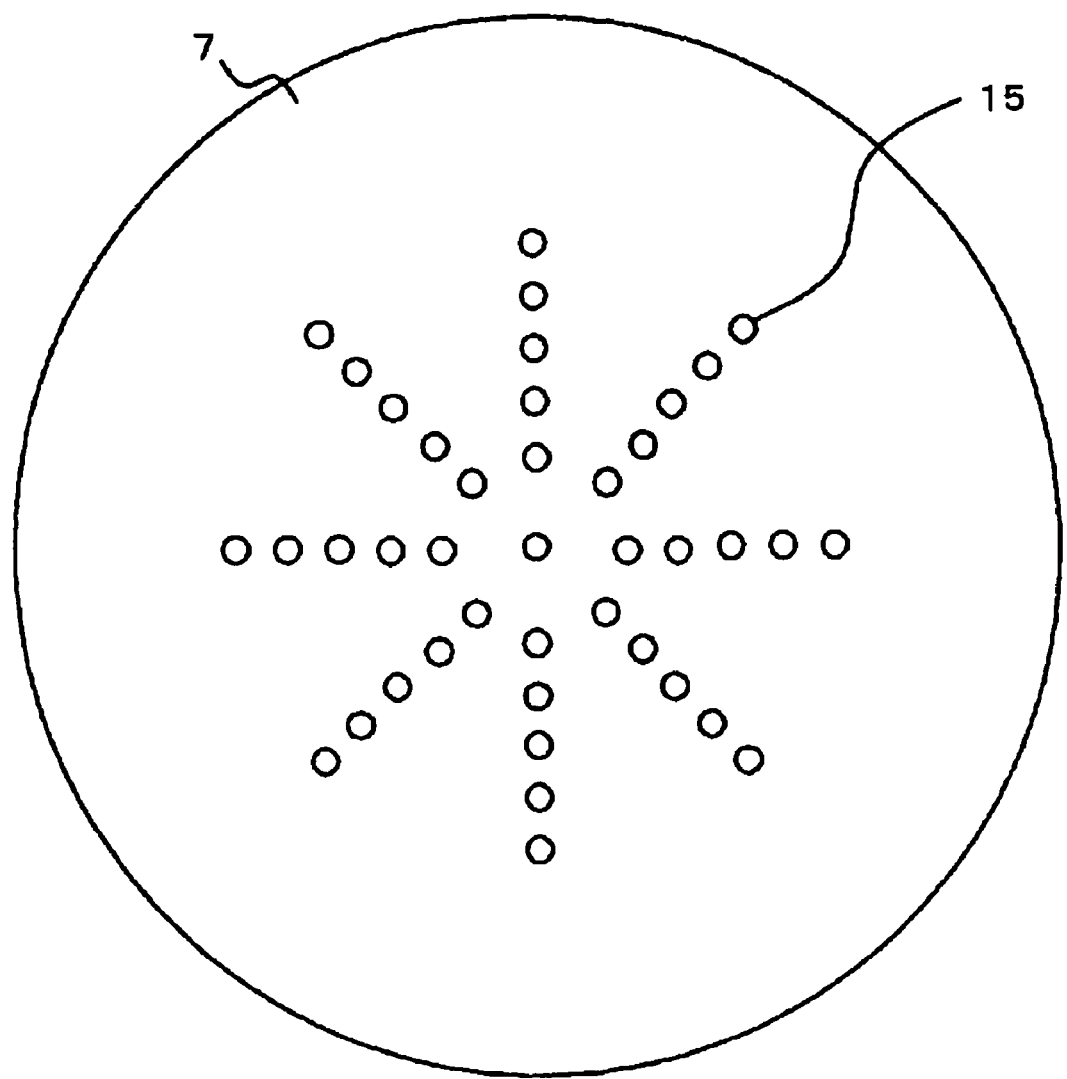
FIG. 2 is a plan view of a dielectric window according to the first embodiment of the invention.

FIG. 2 is a plan view of a dielectric window 7 in FIG. 1 as seen from the bottom. As understood from FIG. 2, the gas flow-out holes 15 are arranged almost symmetrically about the center of the dielectric window 7 to flow-out gas almost isotropically toward a sample. In other words, the plurality of gas flow-out holes 15 are arranged almost isotropically.

In FIG. 1, the vacuum chamber 1 is almost cylindrical. The vacuum chamber 1 includes a through gate 16 and a cylindrical inner chamber 17 fixed to the vacuum chamber 1. The inner chamber 17 is fixed to the vacuum chamber 1 by placing a hood part projecting outside the cylinder on the upper surface of the vacuum chamber 1. The vacuum chamber 1 also includes a cylindrical gate shutter 18 movable between an open position where the through gate 16 is opened and a close position where the through gate is covered. The moving motion is a rotary motion driven by a driving device 19. The inner chamber 17 is arranged inside the gate shutter 18. The inner chamber 17 and the gate shutter 18 are coupled to each other with a cylindrical bearing unit 20.

The lowermost part of the inner chamber 17 is positioned below the lowermost part of the gate shutter 18. Further, the lowermost part of the inner chamber 17 is positioned below the upper surface of the sample electrode 6.

Figure 3:
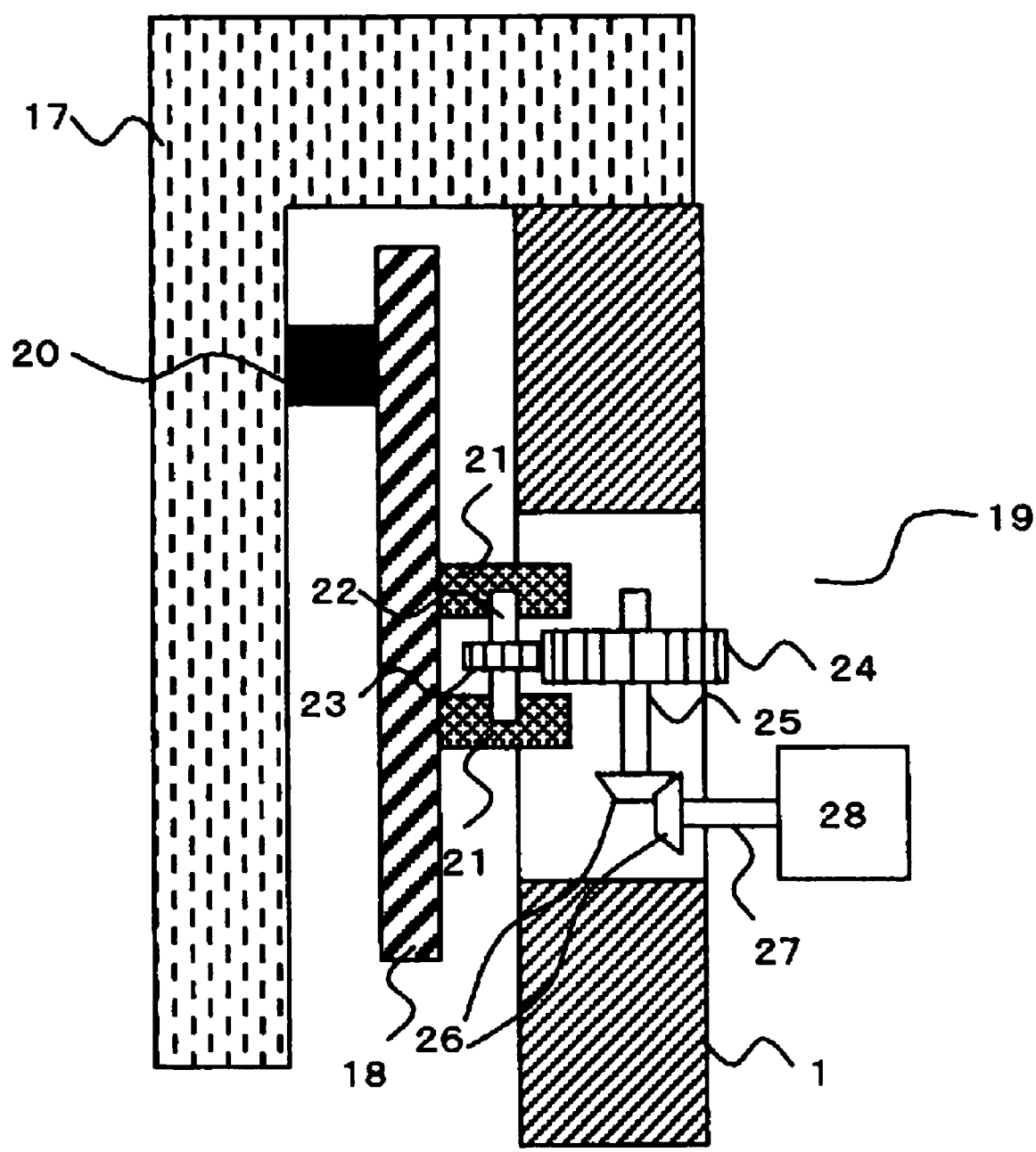
FIG. 3 is a cross-sectional view of a driving device according to the first embodiment of the invention.

FIG. 3 is a cross-sectional view of the driving device 19. In FIG. 3, the inner chamber 17 and the gate shutter 18 are coupled to each other with the cylindrical bearing unit 20. While the bearing unit 20 is not shown in detail in FIG. 3, the bearing unit 20 includes an inner cylinder, an outer cylinder and a bearing. The inner cylinder is fixed to the inner chamber 17 and the outer cylinder is fixed to the gate shutter 18. This arrangement makes it possible to arbitrarily change the relative positions of the inner chamber 17 and the gate shutter 18 concerning a coaxial motion. The gate shutter 18 has a rotary body 21 made of an elastic resin (a chemical-resisting resin such as VITON® or KALREZ®) adhering thereto. The rotary body 21 is fixed to a spindle 22 and a small gear 23 is fixed to almost center of the spindle 22. A large gear 24 coupled to the small gear 23 is provided and is connected to a motor shaft 27 via a shaft 25 and a trapezoidal gear 26. When a motor 28 is operated, its rotary motion is transmitted to the rotary body 21 via a transmission part including the motor shaft 27, the trapezoidal gear 26, the shaft 25, the large gear 24, the small gear 23 and the shaft 22 thus allowing the relative positions of the inner chamber 17 and the gate shutter 18 to be arbitrarily changed concerning the coaxial motion.

With the gate shutter 18 placed in an open position, a sample 9 is transferred into the vacuum chamber 1 via the through gate 16 of the vacuum chamber 1. Next, the sample 9 is mounted on the sample electrode 6 in the vacuum chamber 1. Then the through gate 16 is covered with the gate shutter 18. That is, the driving device 19 is driven to rotate the gate shutter 18 coaxially with the inner chamber 17 to move the gate shutter into the close position. The inside of the vacuum chamber 1 is evacuated while flowing out gas almost isotropically toward the sample 9 from a surface opposed to the sample 9. The inside of the vacuum chamber 1 is controlled at a predetermined pressure level and plasma is generated in the vacuum chamber 1. Impurity ions in the plasma are caused to collide with the surface of the sample 9 to introduce the impurity ions into the surface of the sample 9. To be more specific, with the temperature of the sample electrode 6 maintained at 25° C., the $B_2H_6$ gas diluted with He as well as the He gas are supplied by 5 sccm and 100 sccm respectively into the vacuum chamber 1. With the pressure inside the vacuum chamber 1 maintained at 0.5 Pa, a high-frequency power of 1300 W is supplied to a coil 8 to generate plasma in the vacuum chamber 1. At the same time, a high-frequency power of 250 W is supplied to the sample electrode 6 to cause boron ions in the plasma to collide with the surface of the substrate 9 thereby introducing the boron in the vicinity of the surface of the substrate 9. The intra-plane uniformity of concentration (dose) of boron introduced in the vicinity of the surface of the substrate 9 is an excellent ±0.95%. When the sample 9 is transferred out of the vacuum chamber 1, the driving device 19 is driving again to rotate the gate shutter 18 coaxially with the inner chamber 17 to move the gate shutter 18 into the open position.

For comparison, processing under the same conditions except that the gate shutter 18 is maintained in the open position has shown a poor intra-plane uniformity of dose. Just after the wet maintenance of the inner chamber 17 and the gate shutter 18, the dose near the through gate 16 is large (±1.8%). The dose near the through gate 16 is small (±3.4%) after several hundreds of wafers have been processed. The dose near the through gate 16 is large again (±2.8%) after several thousands of wafers have been processed.

Possible causes for such results will be discussed. Just after the wet maintenance, no boron deposits exist on the inner walls of the inner chamber 17 and the gate shutter 18. The inner wall surface of the through gate 16 is remote from the plasma so that accumulation of boron deposits progresses more slowly than in other regions. The amount per unit time of boron radicals lost from a vapor phase is smaller in a region close to the through gate 16 than elsewhere. Thus, the concentration of boron radicals in the plasma is large and the dose is accordingly large near the through gate 16.

The result obtained after several hundreds of wafers have been processed will be discussed. In this stage, a considerable amount of boron deposits are accumulated on the inner wall surfaces of the inner chamber 17 and the gate shutter 18. As discussed above, Boron deposits are accumulated faster in a region remote from the through gate 16. Since the absorption probability of boron radicals drops as the deposits increase, the deposit amount is saturated earlier in a region remote from the through gate 16. Little amount of boron radicals is absorbed in a region remote from the through gate 16. Thus the concentration of boron radicals in plasma is higher and the dose is larger in a region remote from the through gate 16.

The result obtained after several thousands of wafers have been processed will be discussed. In this stage, a considerable amount of boron deposits are accumulated and saturated on the inner wall surfaces of the inner chamber 17 and the gate shutter 18 as well as the through gate 16. In other words, the absorption probability of boron radicals in a portion inside the vacuum chamber 1 exposed to plasma is low in any location. The inner wall surface of the through gate 16 has a larger surface area exposed to plasma than elsewhere. Thus, boron radicals generated by detachment from the deposits increases, that is, the dose increases in a region close to the through gate 16.

According to this embodiment, the nonuniformity of dose describe above is successfully eliminated by moving the gate shutter 17 into a close position.

In Embodiment 1, the gate shutter 18 is cylindrical. This arrangement allows uniform processing of a circular sample. The vacuum chamber 1 has a cylindrical shape.

With this arrangement, the circular sample 9 is uniformly processed. The cylindrical inner chamber 17 fixed to the vacuum chamber 1 is arranged inside the gate shutter 18. This arrangement enhances the wet maintainability of the device. The lowermost part of the inner chamber 17 is positioned below the lowermost part of the gate shutter 18.

With this arrangement, deposits are accumulated only in a region of the gate shutter 18 close to the opening of the inner chamber 17 under plasma processing. This enhances the wet maintainability of the device.

The lowermost part of the inner chamber 17 is positioned below the upper surface of the sample electrode 6. Plasma is generated mainly above the upper surface of the sample electrode 6 so that more deposits are accumulated above the upper surface of the sample electrode 6. This arrangement enhances the wet maintainability of the device.

The driving device 19 includes a motor 28, a rotary body 21 in intimate contact with a gate shutter 18, and a transmission part for transmitting the rotary motion of the motor 28 to the rotary body 21. This arrangement allows smooth driving of the gate shutter 18. The rotary body 21 is made of an elastic resin. This suppresses generation of particles attributable to rotation of the gate shutter 18. To further reduce particles, a magnet coupling may be used.

The inner chamber 17 is fixed to the vacuum chamber 1 by placing a hood part projecting outside the cylinder on the upper surface of the vacuum chamber 1. This suppresses generation of particles attributable to rotation of the gate shutter 18.

Particles generated at the contact part between the gate shutter 18 or the inner chamber 17 and the bearing unit 20 and the contact part between the gate shutter 18 and the rotary body 21 are blocked by the hood part projecting outside from the cylinder of the inner chamber 17 and do not enter the side of the sample 9 and drop below the lowermost part of the inner chamber 17.

Such an exceptional effect is especially conspicuous in a plasma doping process. In dry etching, deposits accumulated inside a vacuum chamber or an inner chamber is mainly products of an etching reaction and the concentration of an etchant (radical species in charge of etching reaction) in plasma rarely changes. In plasma CVD as well as in dry etching, the ratio of a reactive gas taking the initiative in CVD reaction to a gas supplied into a vacuum chamber is generally 10% or more or at least 3%.

In this case, the concentration of a reaction species in plasma rarely changes to worse the uniformity of processing in accordance with the amount of deposits accumulated inside a vacuum chamber or an inner chamber. In other words, in case the ratio of a reactive gas (diborane, phosphine, arsine or the like) taking the initiative in reaction rather than a rare gas is less than 10% or in particular less than 3% like in plasma doping, the invention is exceptionally advantageous.

Embodiment 2

Figure 4:
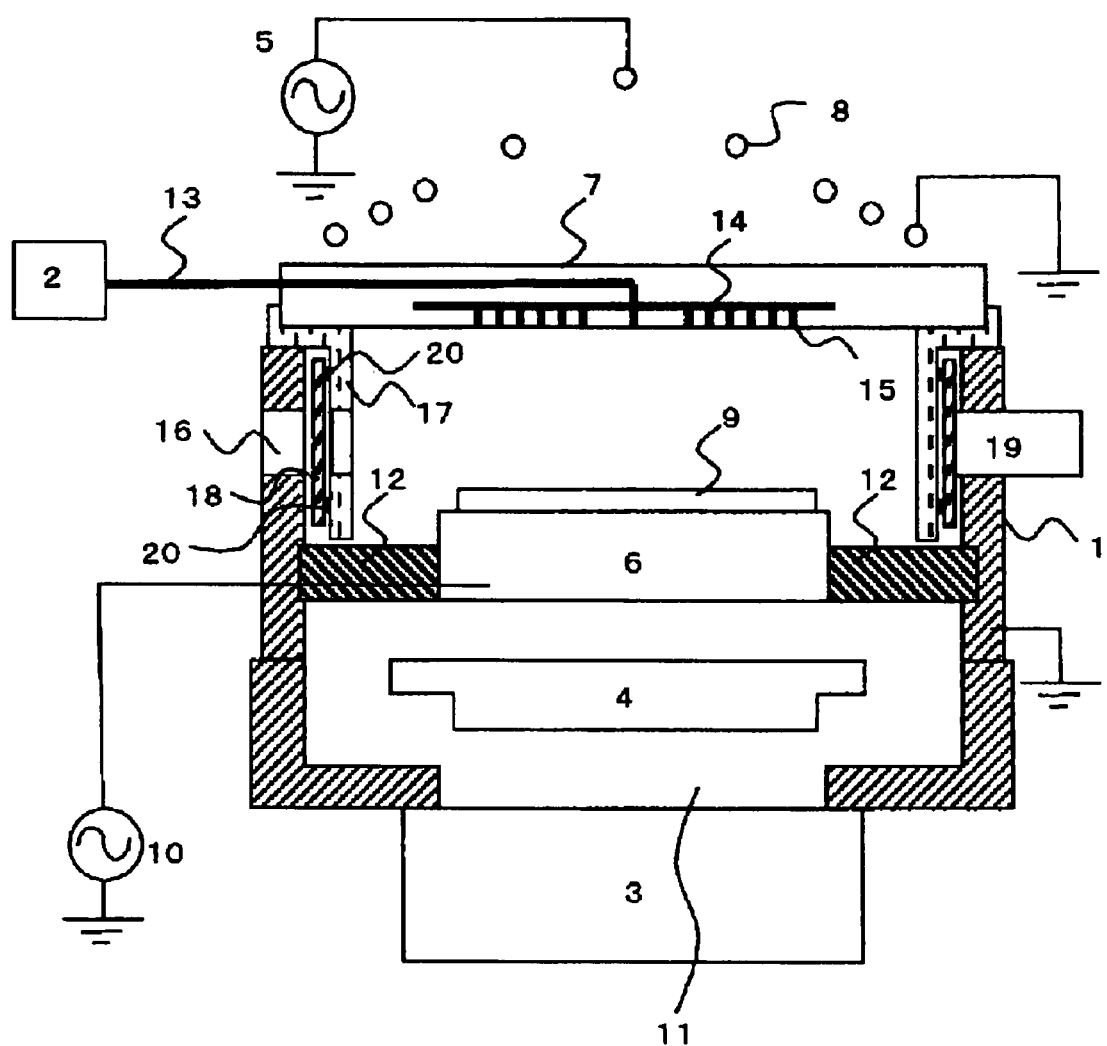
FIG. 4 is a cross-sectional view of a plasma-doping chamber used in the second embodiment of the invention.

Embodiment 2 of the invention will be described referring to FIG. 4. FIG. 4 is a cross-sectional view of a plasma-doping device used in the Embodiment 2 of the invention. Basic configuration in FIG. 4 is the same as that of Embodiment 1 shown in FIG. 1 although two bearing units 20 are respectively arranged in an upper location and a lower location. With this arrangement, the precision of the rotary motion of the gate shutter 18 coaxial with the inner chamber 17 is enhanced. This minimizes the possibility of the inner wall of the gate shutter 18 coming into contact with the outer wall of the inner chamber 17 thus suppressing generation of particles.

Embodiment 3

Figure 5:
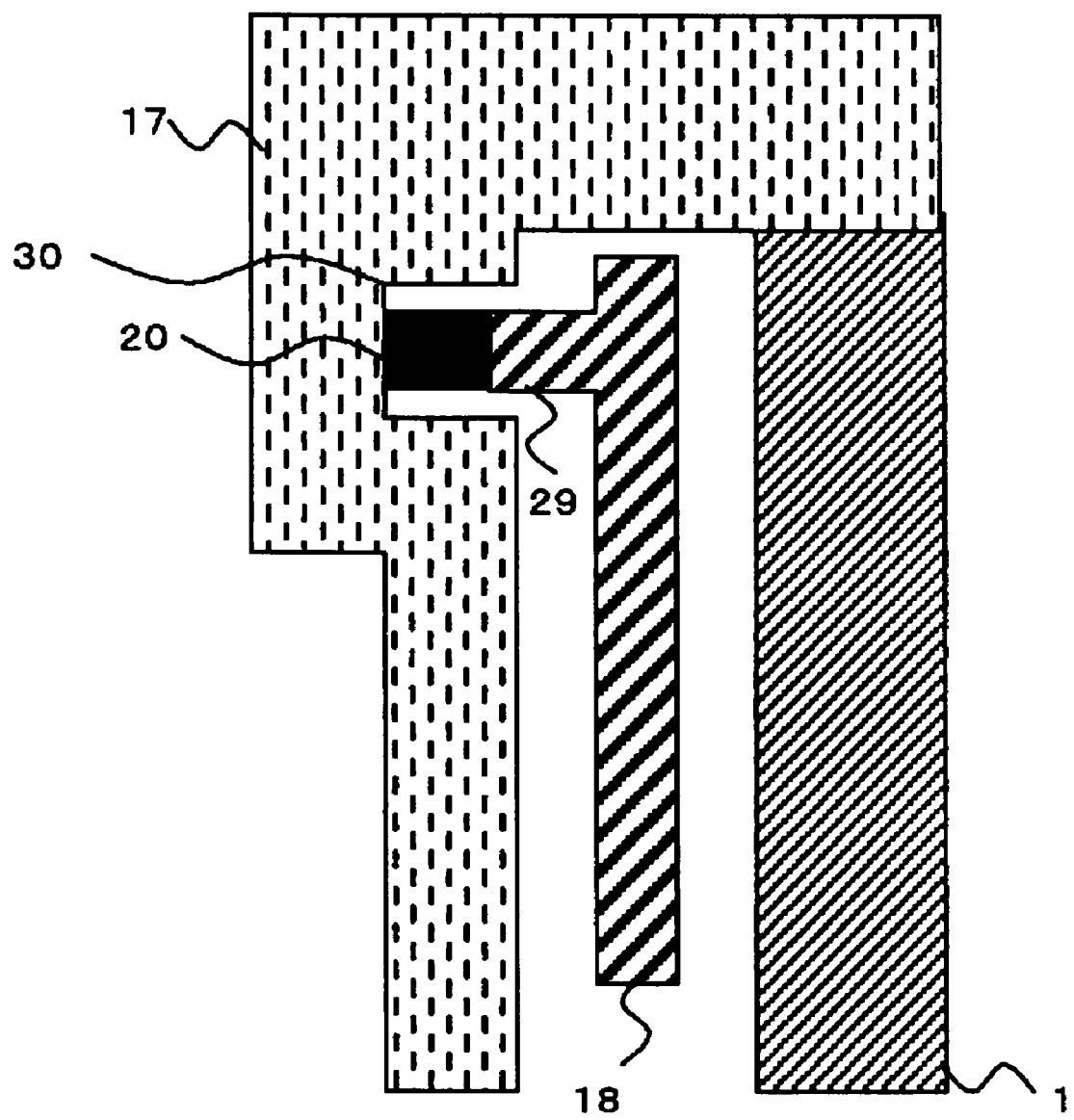
FIG. 5 is a cross-sectional view of a link part of an inner chamber and a gate shutter according to the third embodiment of the invention.

Embodiment 3 of the invention will be described referring to FIG. 5. FIG. 5 is a cross-sectional view of a plasma-doping device used in the Embodiment 3 of the invention with the link part between the inner chamber 17 and the gate shutter 18 being enlarged. In FIG. 5, the inner periphery of a convex part 29 projecting inside the cylinder of the gate shutter 18 is fitted to a concave part 30 provided outside the cylinder of the inner chamber 17. A bearing unit 20 is provided between the convex part 29 and the concave part 30. The inner diameter of the convex part 29 is smaller than the external shape of the cylinder of the inner chamber 17. With this arrangement, it is possible to prevent generation of particles caused by rotation of the gate shutter 17. Particles generated at the contact part between the gate shutter 18 or the inner chamber 17 and the bearing unit 20 due to rotation of the gate shutter 17 mostly build up in the concave part 30 provided outside the cylinder of the inner chamber 17 and a dramatically smaller number of particles drop between the inner chamber 17 and the gate shutter 18.

Embodiment 4

Figure 6:
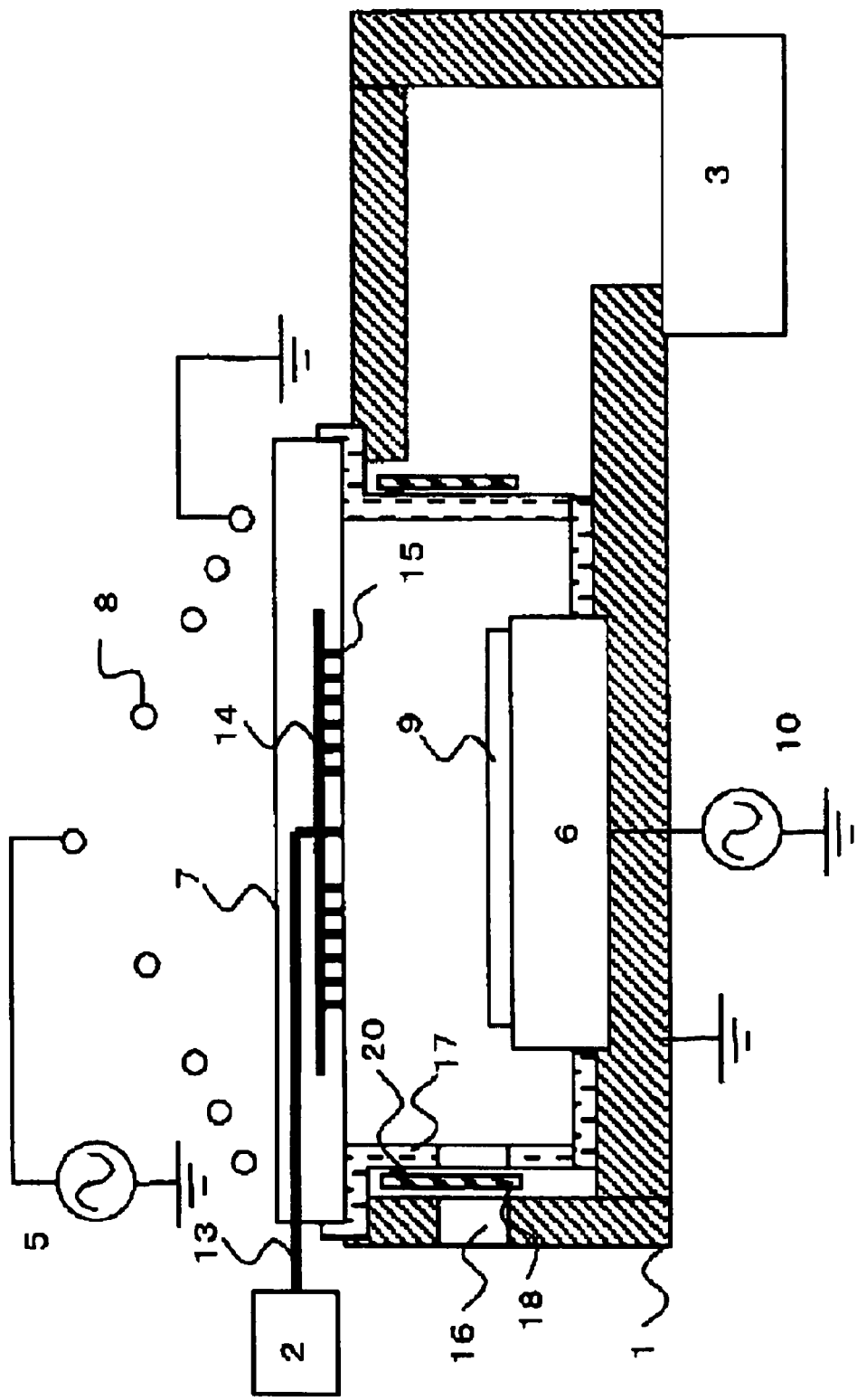
FIG. 6 is a cross-sectional view of a plasma-doping chamber used in the fourth embodiment of the invention.

Embodiment 4 of the invention will be described referring to FIGS. 6 through 8. FIG. 6 is a cross-sectional view of a plasma-doping device used in Embodiment 4 of the invention. Basic configuration in FIG. 6 is the same as that of Embodiment 1 shown in FIG. 1 although the vacuum chamber 1 is not cylindrical, the pump 3 as an exhaust device is arranged at the opposite side of the through gate 16, and an inner chamber bottom is provided to the inner chamber 17.

With this arrangement, gas exhaust takes place faster in a region remote from the through gate 16 (close to the pump 3). In case plasma processing is made in the absence of the gate shutter 18 or while the gate shutter 18 is placed in an open position, dose appears nonuniform more conspicuously than Embodiment 1. That is, in such an arrangement, the uniformity improvement effect through plasma processing with the gate shutter 18 in an open position is exceptional.

Figure 7:
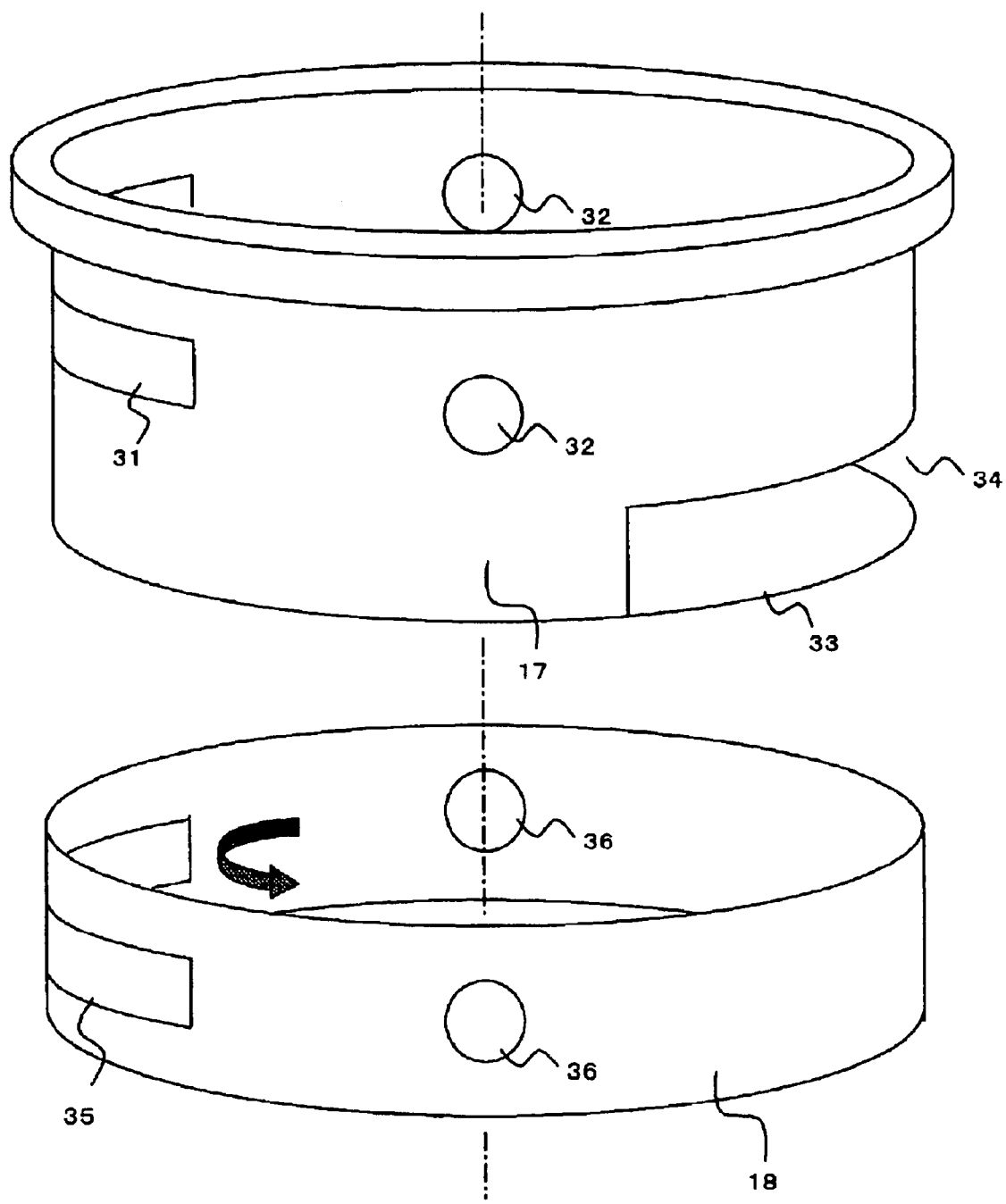
FIG. 7 is a perspective view of an inner chamber and a gate shutter used in the fourth embodiment of the invention.
Figure 8:
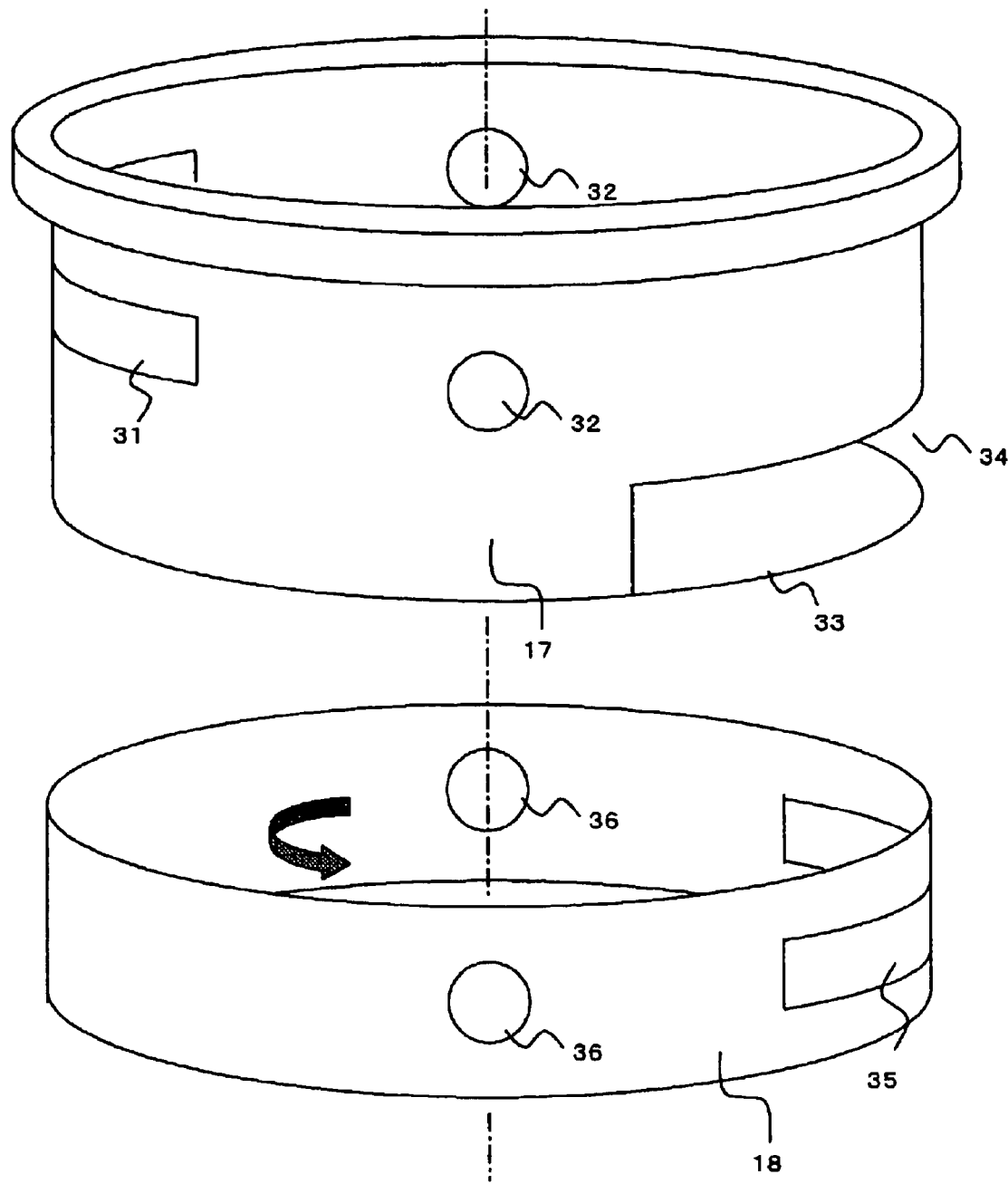
FIG. 8 is a perspective view of the inner chamber and the gate shutter used in the fourth embodiment of the invention.
Figure 9:
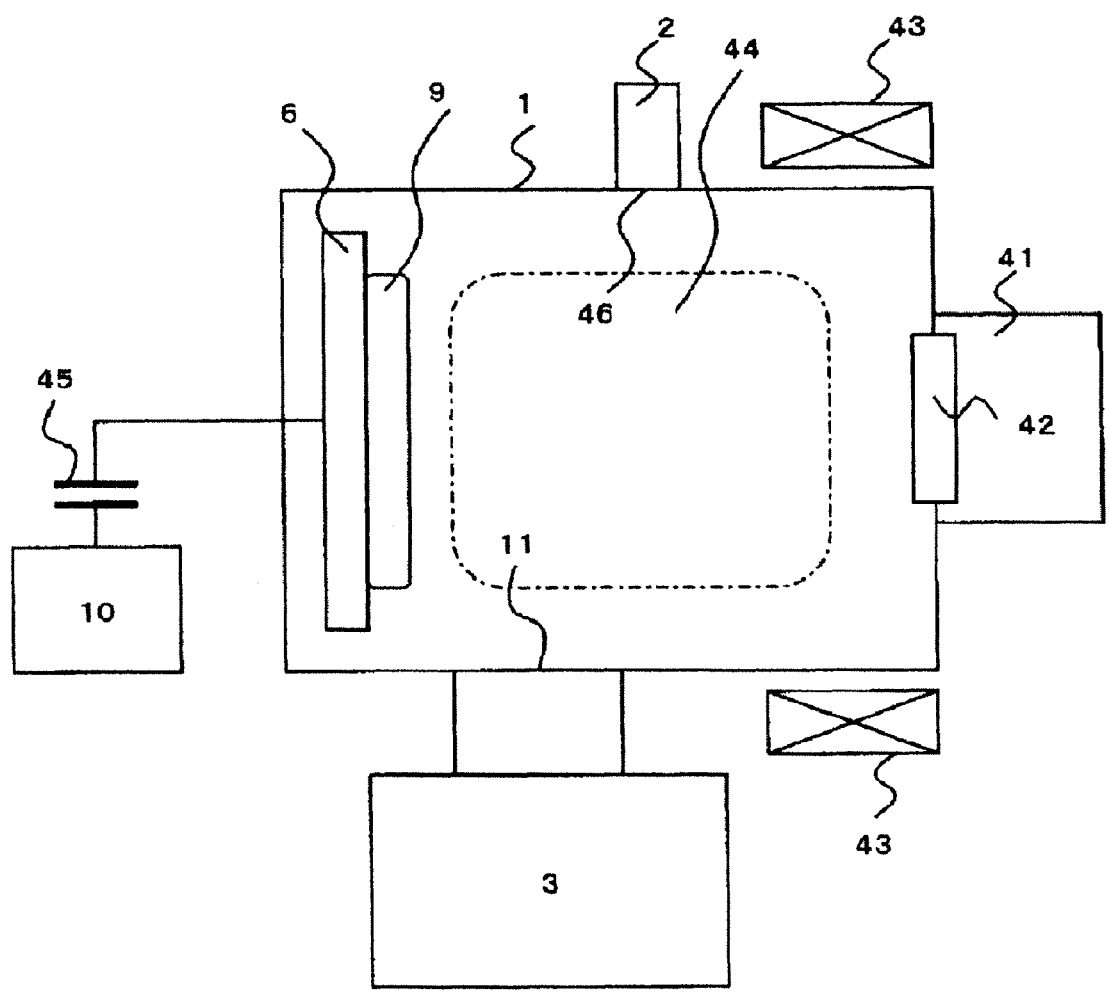
FIG. 9 is a cross-sectional view of a plasma-doping device used in a related art example.
Figure 10:
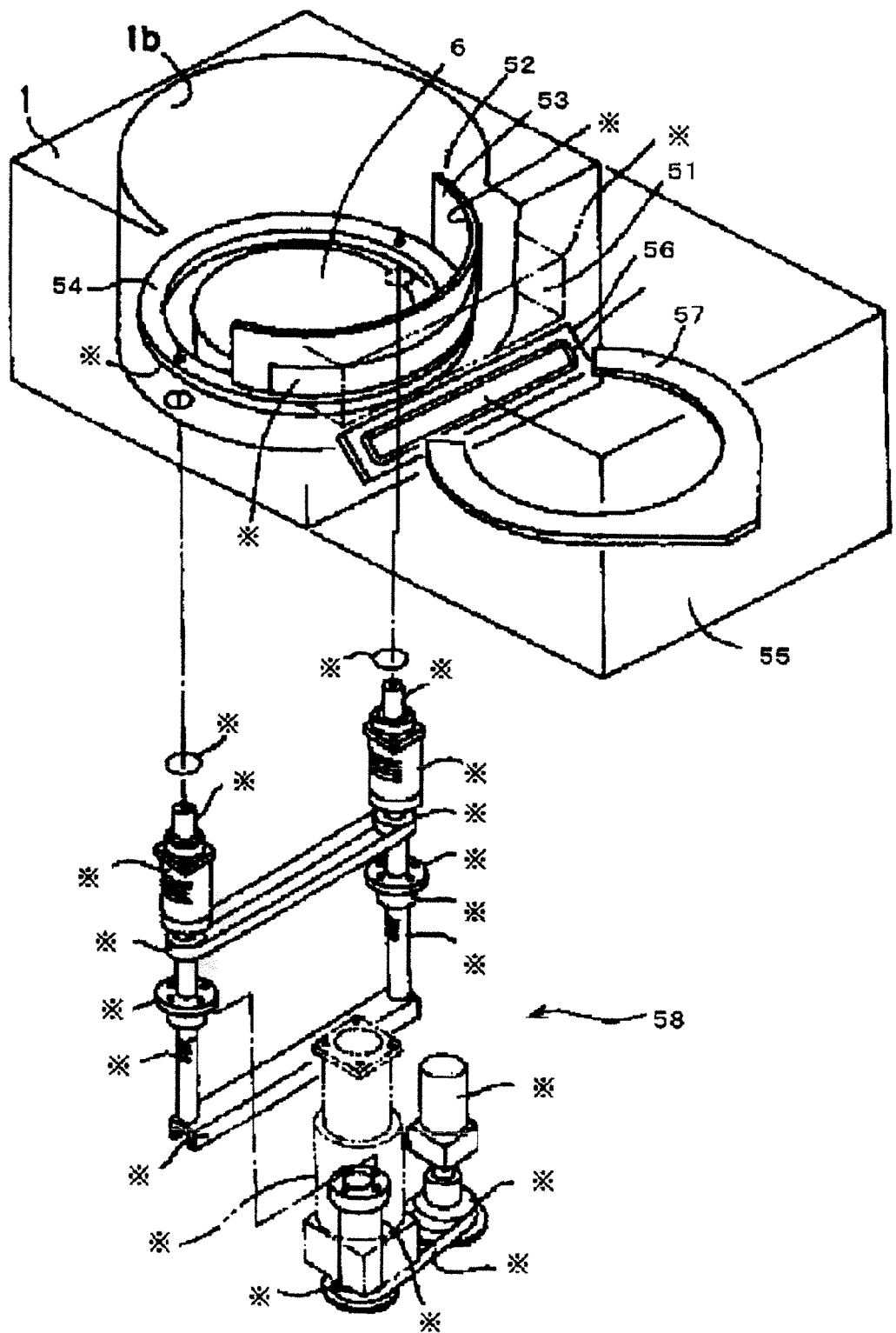
FIG. 10 is a cross-sectional view of a dry etching device used in the related art example.

FIG. 7 is a perspective view of the inner chamber 17 and the gate shutter 18. In FIG. 7, the inner chamber 17 is almost cylindrical but a gate opening 31 is arranged in a position corresponding to the through gate 16 and a window opening 32 is arranged in a position corresponding to a plasma observation window. An inner chamber bottom 33 is a cover for suppressing buildup of deposits on the bottom of a vacuum chamber. An exhaust opening 34 is an opening for exhausting inside of the vacuum chamber.

The gate shutter 18 has a gate opening 35 arranged in a position corresponding to the through gate and a window opening 36 arranged in a position corresponding to a plasma observation window.

FIG. 7 shows the arrangement in the open position. Arrangement in the close position is shown in FIG. 8.

The foregoing embodiments only cover part of various variations concerning the shape of a vacuum chamber a plasma source system and its arrangement in the scope of the invention. A variety of other variations may be used when the invention is applied.

For example, the coil 8 may have a planar shape. Or, a helicon wave plasma source, a magnetic neutral loop plasma source, a high magnetic field microwave plasma source (electron cyclotron resonance plasma source) or a parallel planar type plasma source may be used.

Use of an inductive-coupling plasma source makes it easy to form a gas flow-out hole in the surface opposed to a sample (electrode), which approach is favorable in terms of device arrangement.

An inert gas other than helium may be used. At least a gas out of neon, argon, krypton, and xenon may be used. Such an inert gas has an advantage that it causes smaller adverse effects on a sample.

While a sample used in the embodiments is a semiconductor substrate made of silicon, the invention is applicable to processing of a sample made of other materials. Note that the invention is an especially useful plasma doping method in case a sample used is a semiconductor substrate made of silicon. The plasma doping method is especially useful in case the purities are arsenic, phosphorus, boron, aluminum, or antimony. With this arrangement, it is possible to manufacture a ultrafine silicon semiconductor device.

The plasma processing device according to the invention is applicable to dry etching and plasma CVD as well as plasma doping.

While the invention has been detailed in terms of its specific embodiments, hose skilled in the art will recognize that various changes and modifications can be made in it without departing the spirit and scope thereof.

The invention is based on the Japanese Patent Application No. 2005-099149 filed Mar. 30, 2005 and its content is herein incorporated as a reference.

INDUSTRIAL APPLICABILITY

A plasma doping method and a plasma processing device according to the invention provides a plasma doping method excellent in the uniformity of concentration of impurities introduced into the surface of a sample and a plasma processing device capable of uniformly performing plasma processing of a sample. The invention is applicable to the impurity doping process for a semiconductor, manufacture of a thin-film transistor used for a liquid crystal, improvement of the surface quality of various materials and the like.

The invention claimed is:

1. A plasma processing device comprising:
a vacuum chamber;
a sample electrode;
a gas supply device for supplying gas into the vacuum chamber;
gas blowout holes arranged isotropically while opposed to the sample electrode; an exhaust port for evacuating the inside of the vacuum chamber;
a pressure controller for controlling the pressure inside the vacuum chamber; and
a sample electrode power source for supplying power to the sample electrode, wherein:
the vacuum chamber includes a through gate and a gate shutter including a driving device movable between an open position where the through gate is opened and a close position where the through gate is covered,
said driving device includes a motor, a rotary body in intimate contact with the gate shutter, and a transmission part for transmitting the rotary motion of the motor to the rotary body,
said gate shutter has a cylindrical shape and includes an opening,
said vacuum chamber has a cylindrical shape,
said plasma processing device further includes a cylindrical inner chamber fixed to the vacuum chamber inside said gate shutter,
the lowermost part of said cylindrical inner chamber is positioned below the lowermost part of said gate shutter,
the lowermost part of said cylindrical inner chamber is positioned below the upper surface of the sample electrode,
said cylindrical inner chamber is fixed to the vacuum chamber by placing a hood part projecting outside the cylinder on the upper surface of the vacuum chamber, and
said cylindrical inner chamber and said gate shutter are coupled to each other with a first and second cylindrical bearing units, the first cylindrical bearing unit being provided at a position higher than the through gate, and the second cylindrical bearing unit being provided at a position lower than the through gate.

2. The plasma processing device according to claim 1, wherein said rotary body is made of an elastic resin.

3. The plasma processing device according to claim 1, wherein the gate shutter is provided between the vacuum chamber and the cylindrical inner chamber.

4. The plasma processing device according to claim 1, wherein the gate shutter does not contact the vacuum chamber when the gate shutter is closed.

* * * * *